United States Patent
Tsau

(10) Patent No.: US 9,419,100 B2
(45) Date of Patent: *Aug. 16, 2016

(54) METHOD FOR FABRICATING A METAL GATE ELECTRODE

(71) Applicant: TAIWAN SEMICONDUCTOR MANUFACTURING COMPANY, LTD., Hsinchu (TW)

(72) Inventor: Hsueh Wen Tsau, Zhunan Township (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/810,737

(22) Filed: Jul. 28, 2015

(65) Prior Publication Data

US 2015/0332975 A1 Nov. 19, 2015

Related U.S. Application Data

(62) Division of application No. 12/982,451, filed on Dec. 30, 2010, now Pat. No. 9,105,653.

(60) Provisional application No. 61/394,176, filed on Oct. 18, 2010.

(51) Int. Cl.
| | |
|---|---|
| H01L 29/66 | (2006.01) |
| H01L 21/28 | (2006.01) |
| H01L 21/321 | (2006.01) |
| H01L 21/285 | (2006.01) |
| H01L 21/311 | (2006.01) |
| H01L 21/8238 | (2006.01) |

(52) U.S. Cl.
CPC .... *H01L 29/66545* (2013.01); *H01L 21/28088* (2013.01); *H01L 21/28568* (2013.01); *H01L 21/31116* (2013.01); *H01L 21/3212* (2013.01); *H01L 21/82385* (2013.01); *H01L 21/823842* (2013.01)

(58) Field of Classification Search
CPC ................. H01L 21/823842; H01L 21/82385; H01L 29/66545
See application file for complete search history.

(56) References Cited

U.S. PATENT DOCUMENTS

| | | |
|---|---|---|
| 6,121,086 A | 9/2000 | Kuroda et al. |
| 2006/0008973 A1 | 1/2006 | Phua et al. |
| 2006/0261398 A1 | 11/2006 | Lee |
| 2007/0166981 A1 | 7/2007 | Furukawa et al. |
| 2008/0283932 A1 | 11/2008 | Visokay |
| 2009/0325360 A1* | 12/2009 | Lim ................. H01L 21/76229 438/424 |
| 2010/0044783 A1 | 2/2010 | Chuang et al. |
| 2010/0065926 A1 | 3/2010 | Yeh et al. |
| 2010/0081262 A1 | 4/2010 | Lim et al. |
| 2010/0124818 A1 | 5/2010 | Lee et al. |
| 2011/0076844 A1 | 3/2011 | Heinrich et al. |

\* cited by examiner

*Primary Examiner* — Lex Malsawma
(74) *Attorney, Agent, or Firm* — Hauptman Ham, LLP

(57) ABSTRACT

Exemplary methods for fabricating a metal gate electrode include forming a dielectric layer on a substrate, and forming a first trench having a first width and a second trench having a second width in the dielectric layer where the first width is less than the second width. Also included is depositing a work-function metal layer over the dielectric layer and into the first and second trenches where the deposited work-function layer is in direct contact with the top surface of the dielectric layer. A first signal metal layer is deposited over the work-function metal layer filling the second trench and a second signal metal layer is deposited filling the first trench.

20 Claims, 14 Drawing Sheets

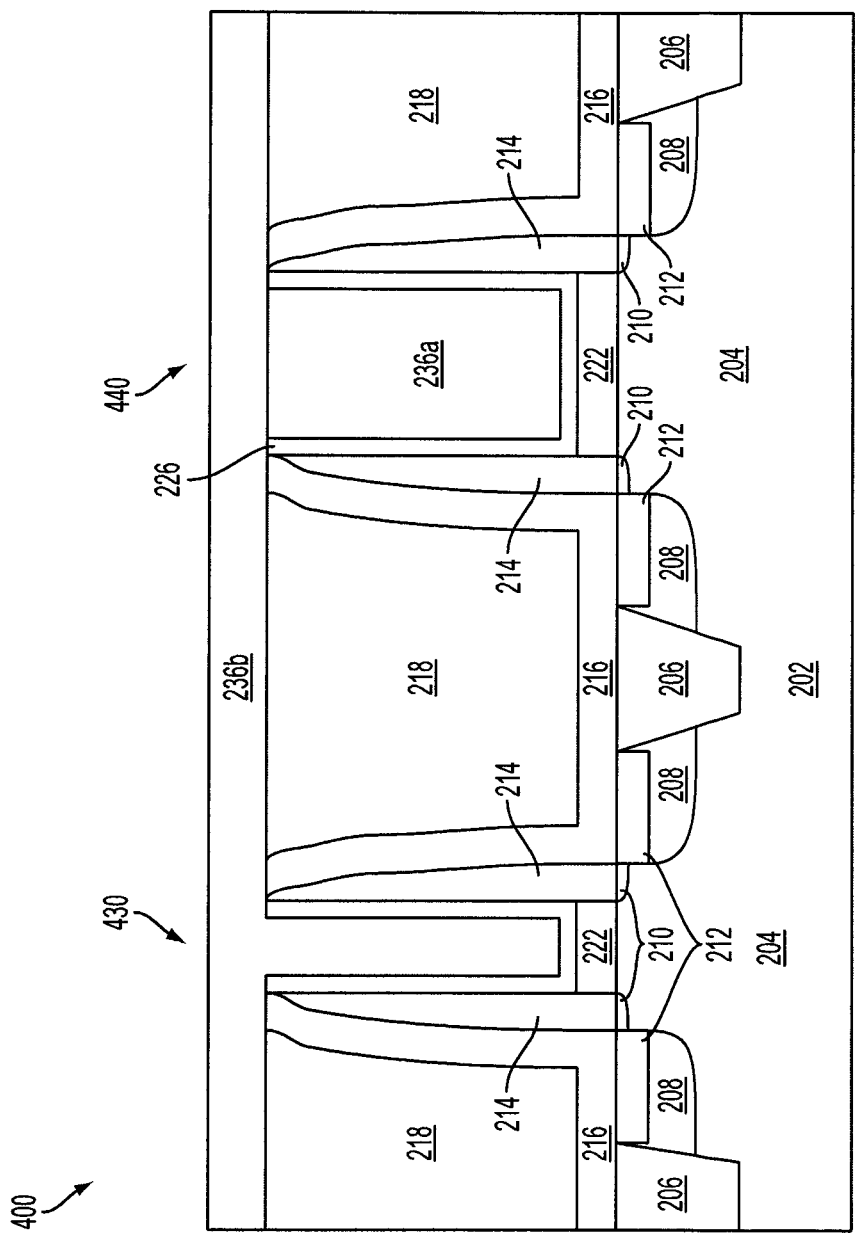

METHOD FOR FABRICATING A METAL GATE ELECTRODE

PRIORITY CLAIM

The present application is a divisional of U.S. application Ser. No. 12/982,451, filed Dec. 30, 2010, which claims priority of U.S. Provisional Application No. 61/394,176, filed Oct. 18, 2010, both applications are incorporated herein, by reference, in their entireties.

TECHNICAL FIELD

The disclosure relates to integrated circuit fabrication, and more particularly, to metal gate electrode fabrication.

BACKGROUND

Semiconductor devices are used in a large number of electronic devices, such as computers, cell phones, and others. Semiconductor devices comprise integrated circuits (ICs) that are formed on semiconductor wafers by depositing many types of thin films of material over the semiconductor wafers, and patterning the thin films of material to form the ICs. The ICs include field-effect transistors (FETs), such as metal-oxide-semiconductor field-effect transistors (MOSFETs).

As technology nodes shrink, in some IC designs, there has been a desire to replace the common poly-silicon gate electrode with a metal gate electrode to improve device performance with the decreased feature sizes. One process of forming the metal gate electrode is termed "gate last" process in which the final metal gate electrode is fabricated after all of the other transistor components, which allows for reduced number of subsequent processes, including high temperature processing, that are to be performed after formation of the gate.

However, there are challenges to implementing such features and processes in complementary metal-oxide-semiconductor (CMOS) fabrication. As the gate length and spacing between devices decrease, these problems are exacerbated. For example, in a "gate last" fabrication process, it is difficult to achieve a low gate resistance for a FET because voids are generated in the metal gate electrode after metal layer deposition for gap filling of a high-aspect-ratio trench, thereby increasing the likelihood of device instability and/or device failure.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the relative dimensions of the various features may be arbitrarily increased or reduced for clarity of discussion.

FIGS. 4A-D show schematic cross-sectional views of a metal gate electrode at various stages of fabrication according to various aspects of the present disclosure.

DETAILED DESCRIPTION

Figure 1:
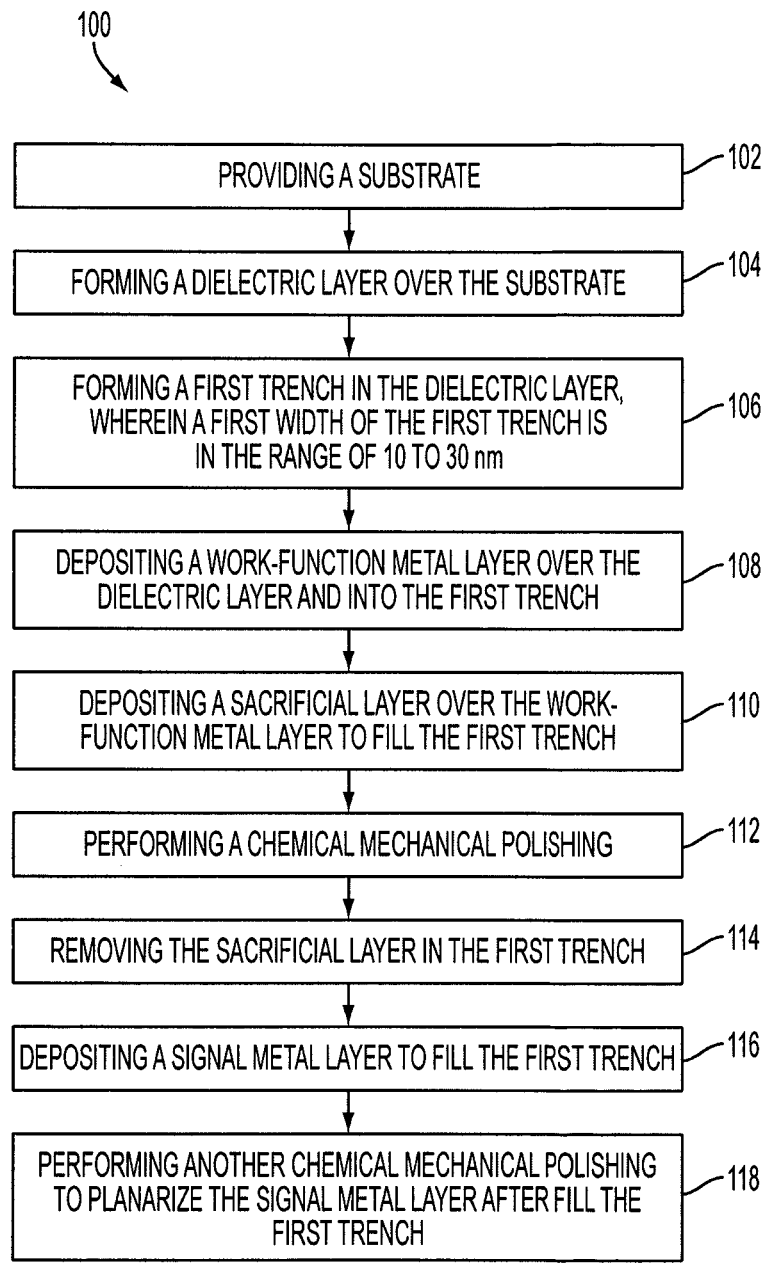
FIG. 1 is a flowchart illustrating a method for fabricating a metal gate electrode according to various aspects of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the present disclosure may repeat reference numerals and/or letters in the various examples. This repetition is for the purpose of simplicity and clarity and does not in itself dictate a relationship between the various embodiments and/or configurations discussed. Various features may be arbitrarily drawn in different scales for simplicity and clarity. In addition, the present disclosure provides examples based on a "gate last" metal gate electrode, however, one skilled in the art may recognize applicability to other structures and/or use of other materials.

Referring to FIG. 1, illustrated is a flowchart of a method 100 for fabricating a metal gate electrode according to various aspects of the present disclosure. The method 100 begins with step 102 in which a substrate is provided. The method 100 continues with step 104 in which a dielectric layer is formed over the substrate. The method 100 continues with step 106 in which a first trench is formed in the dielectric layer, wherein a first width of the first trench is in the range of 10 to 30 nm. The method 100 continues with step 108 in which a work-function metal layer is deposited over the dielectric layer and into the first trench. The method 100 continues with step 110 in which a sacrificial layer is deposited over the work-function metal layer to fill the first trench. The method 100 continues with step 112 in which a chemical mechanical polishing is performed. The method 100 continues with step 114 in which the sacrificial layer in the first trench is removed. The method 100 continues with step 116 in which a signal metal layer is deposited to fill the first trench. The method 100 continues with step 118 in which another chemical mechanical polishing is performed to planarize the signal metal layer after fill the first trench. In some embodiments, one or more of the described steps are performed in different orders or replaced with other steps or omitted. The discussion that follows illustrates one or more embodiments of a method in accordance with FIG. 1.

Figure 2A:
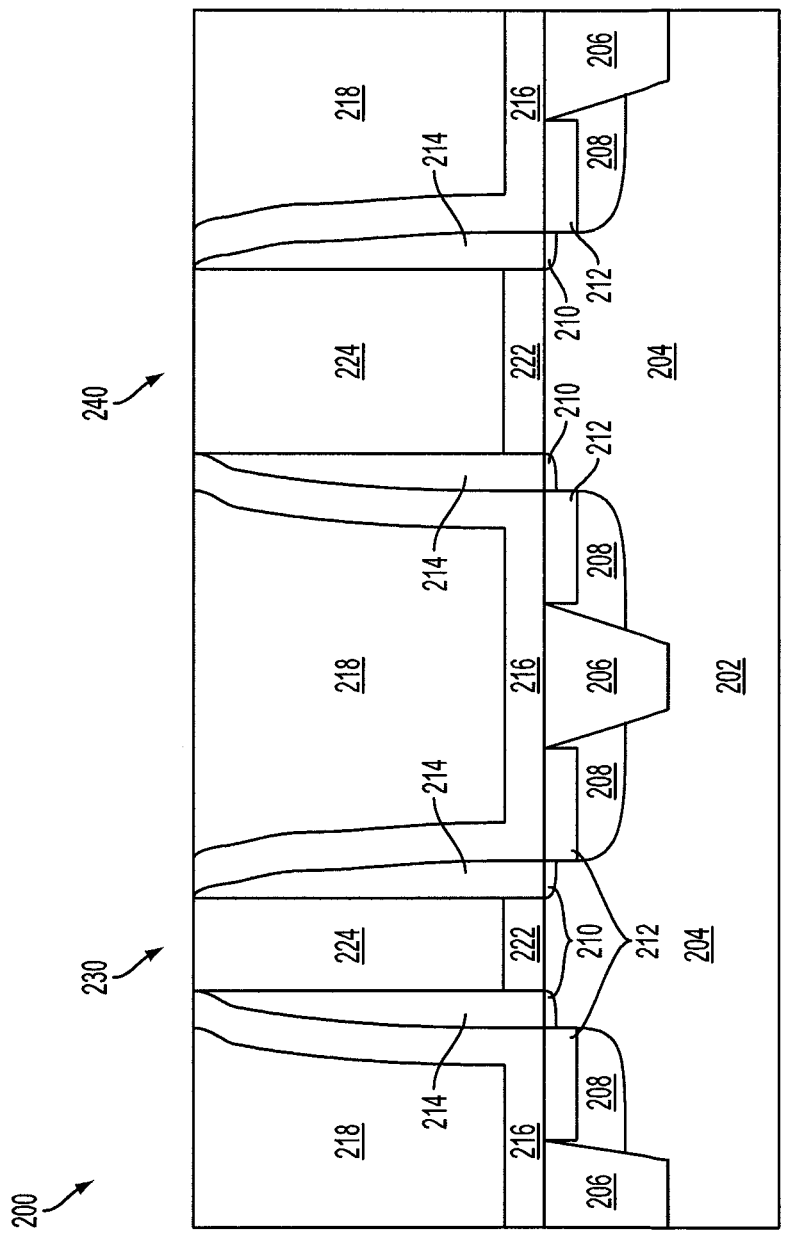
FIGS. 2A-H show schematic cross-sectional views of a metal gate electrode at various stages of fabrication according to various aspects of the present disclosure.
Figure 2B:
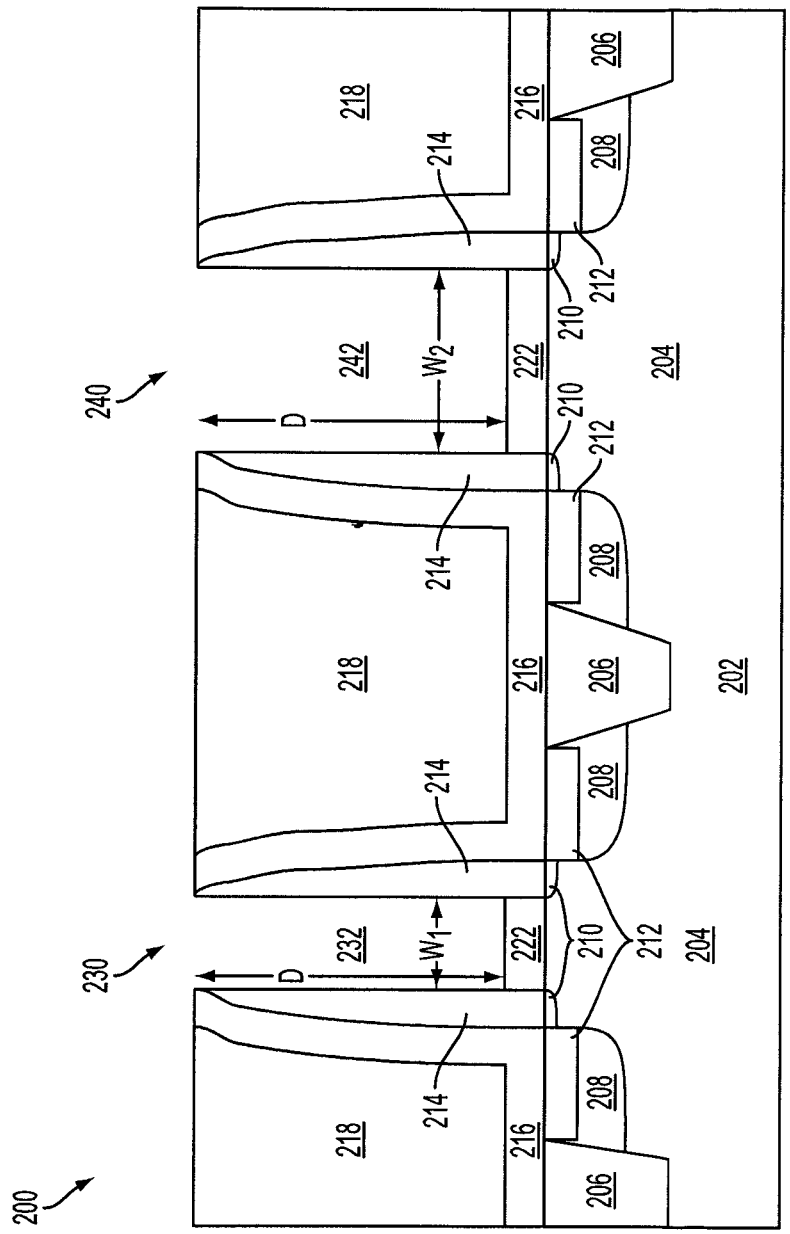
Figure 2C:
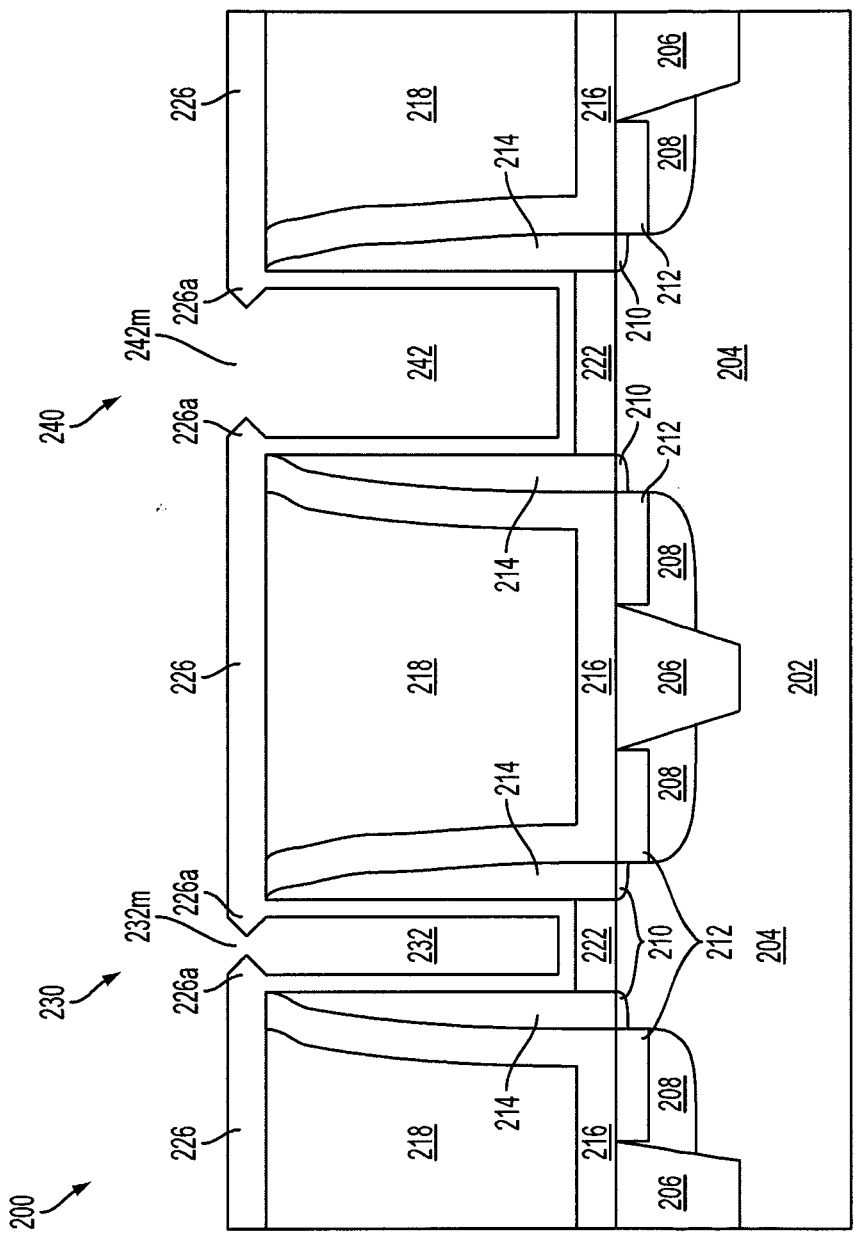
Figure 2D:
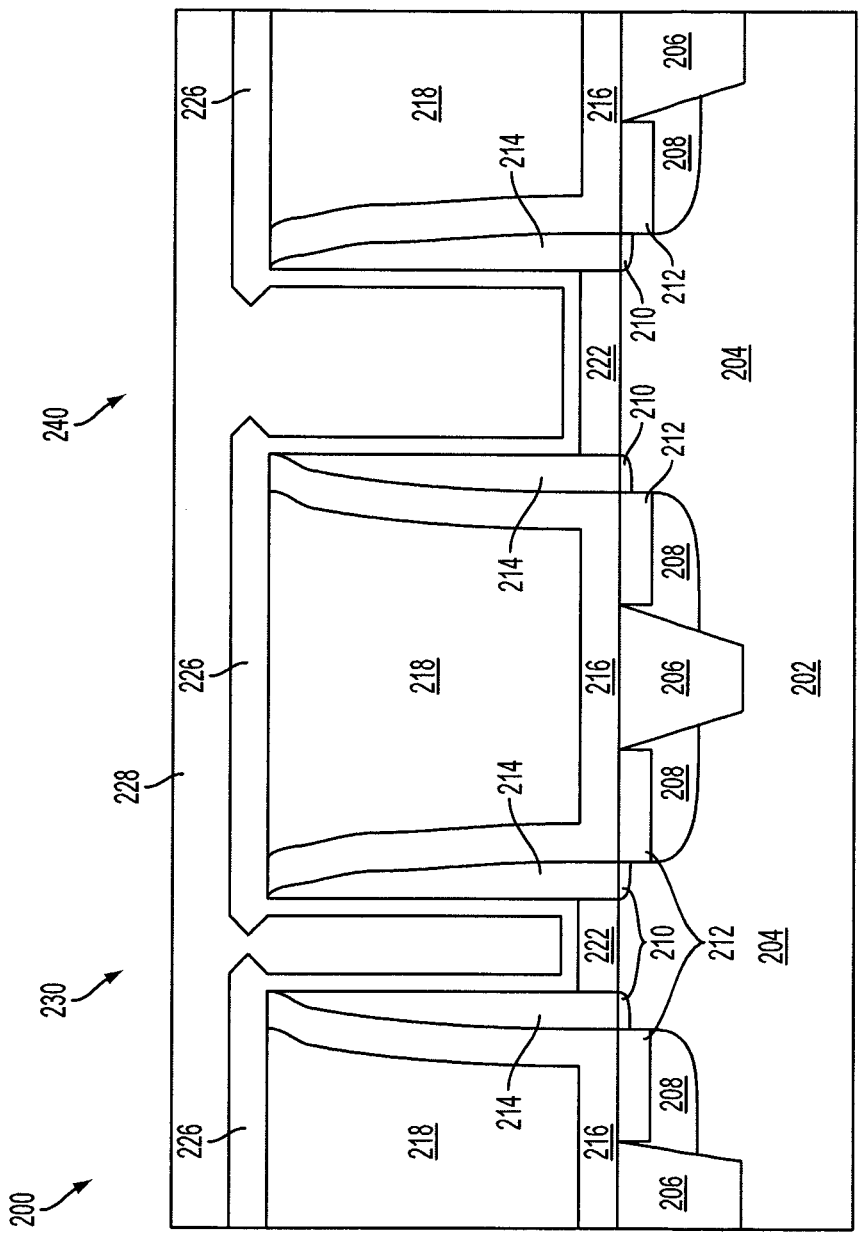
Figure 2E:
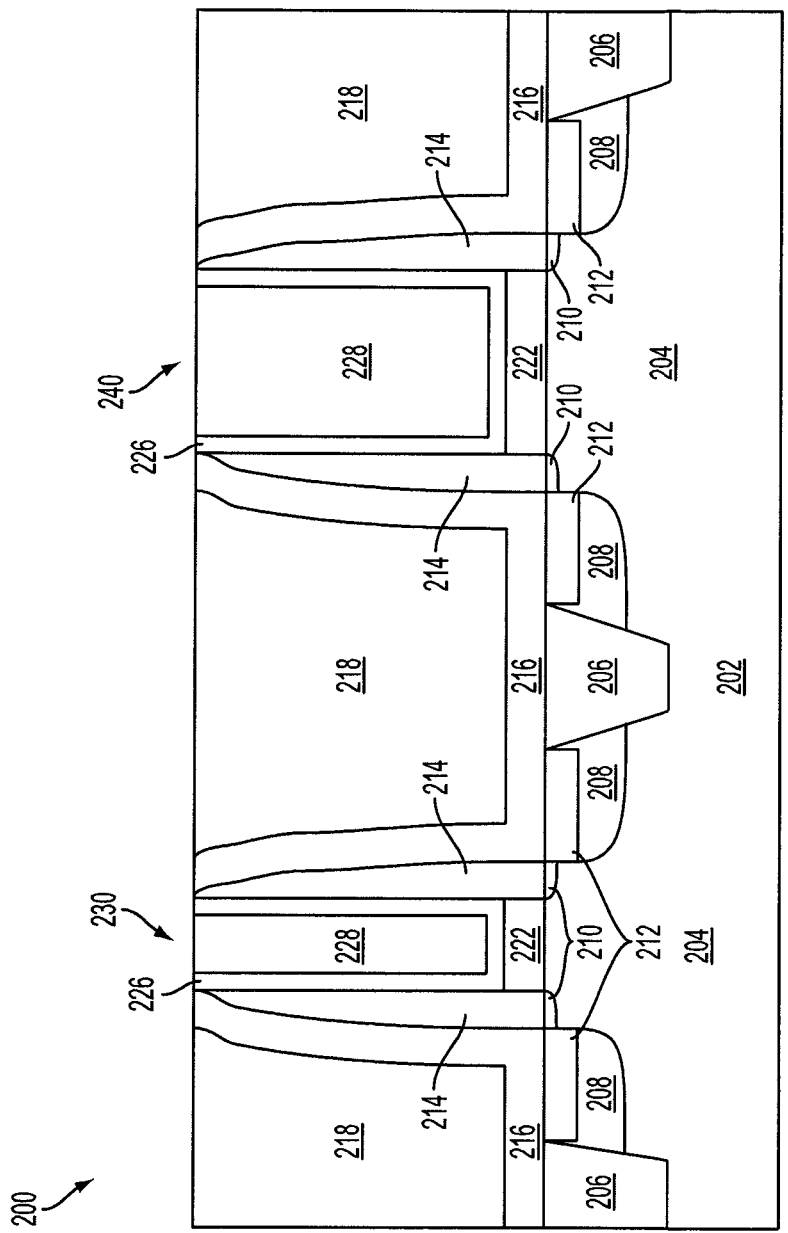
Figure 2F:
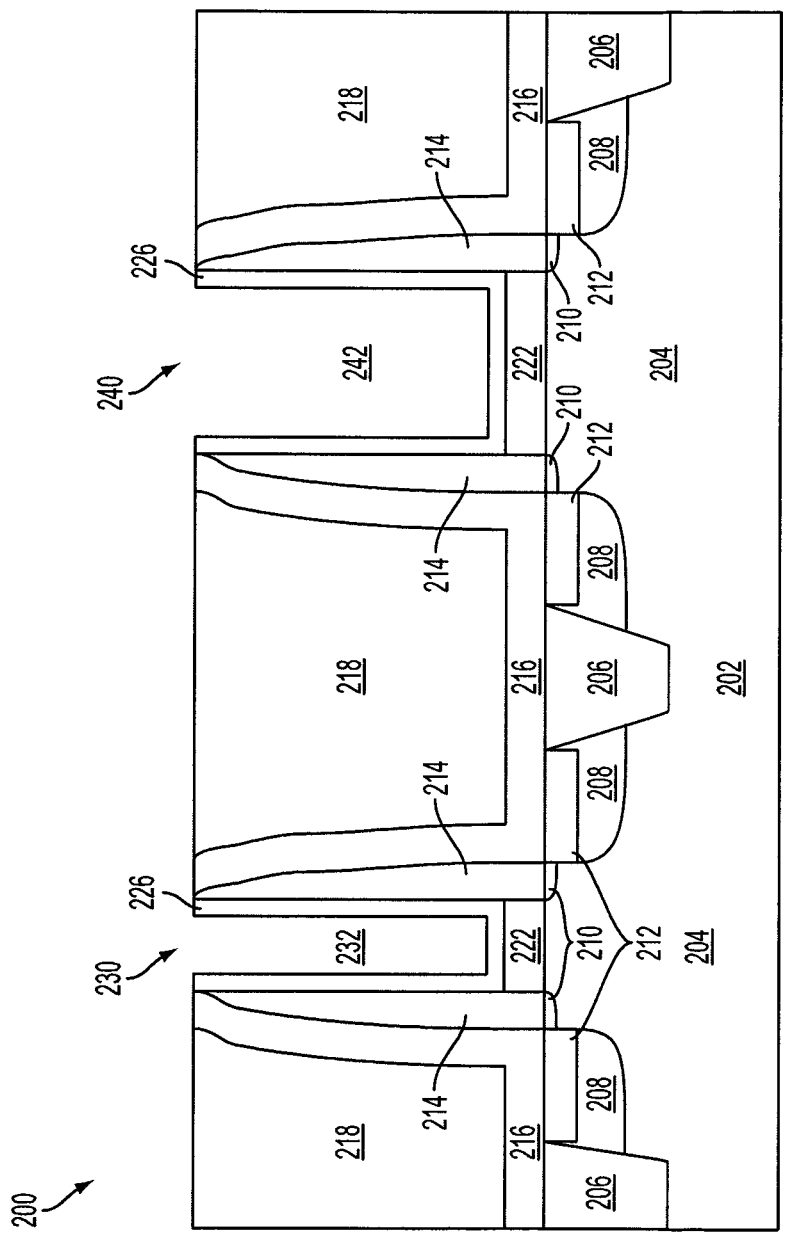
Figure 2G:
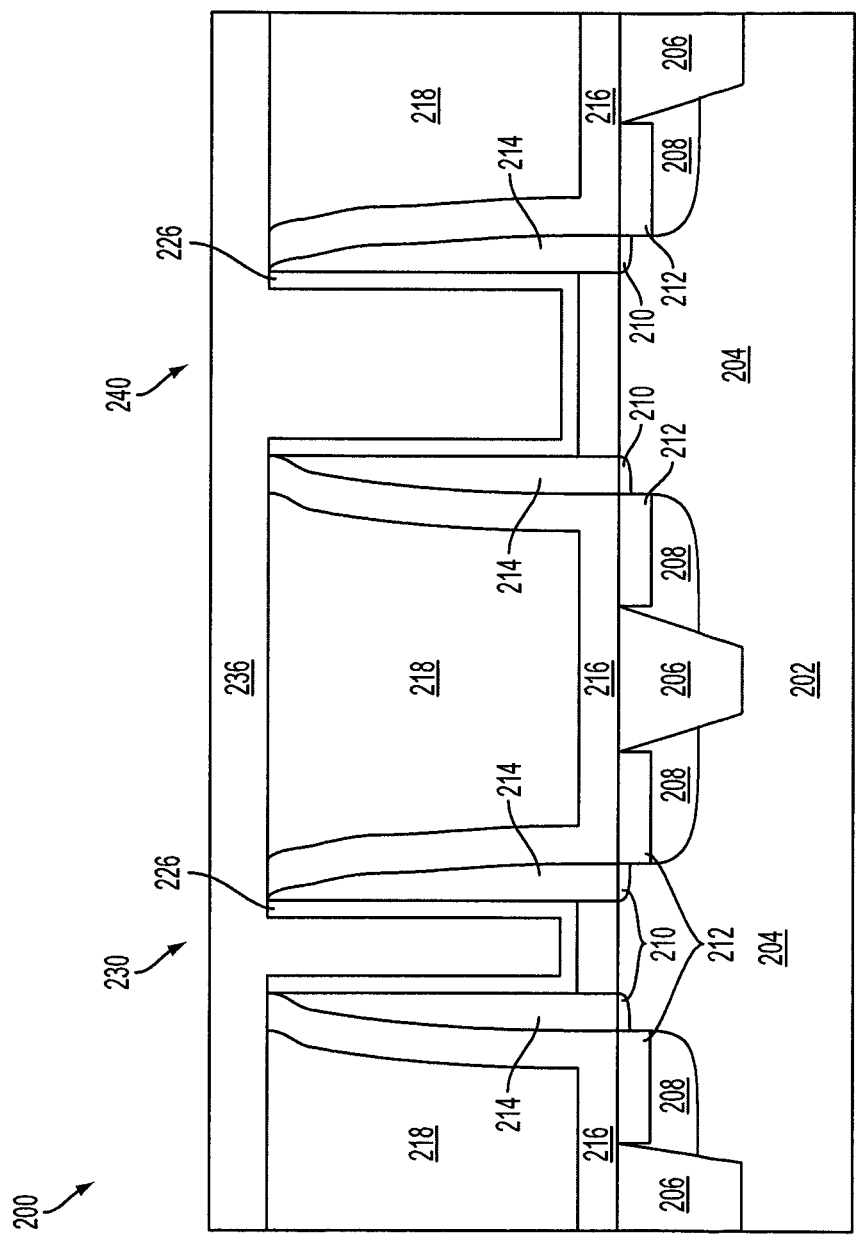
Figure 2H:
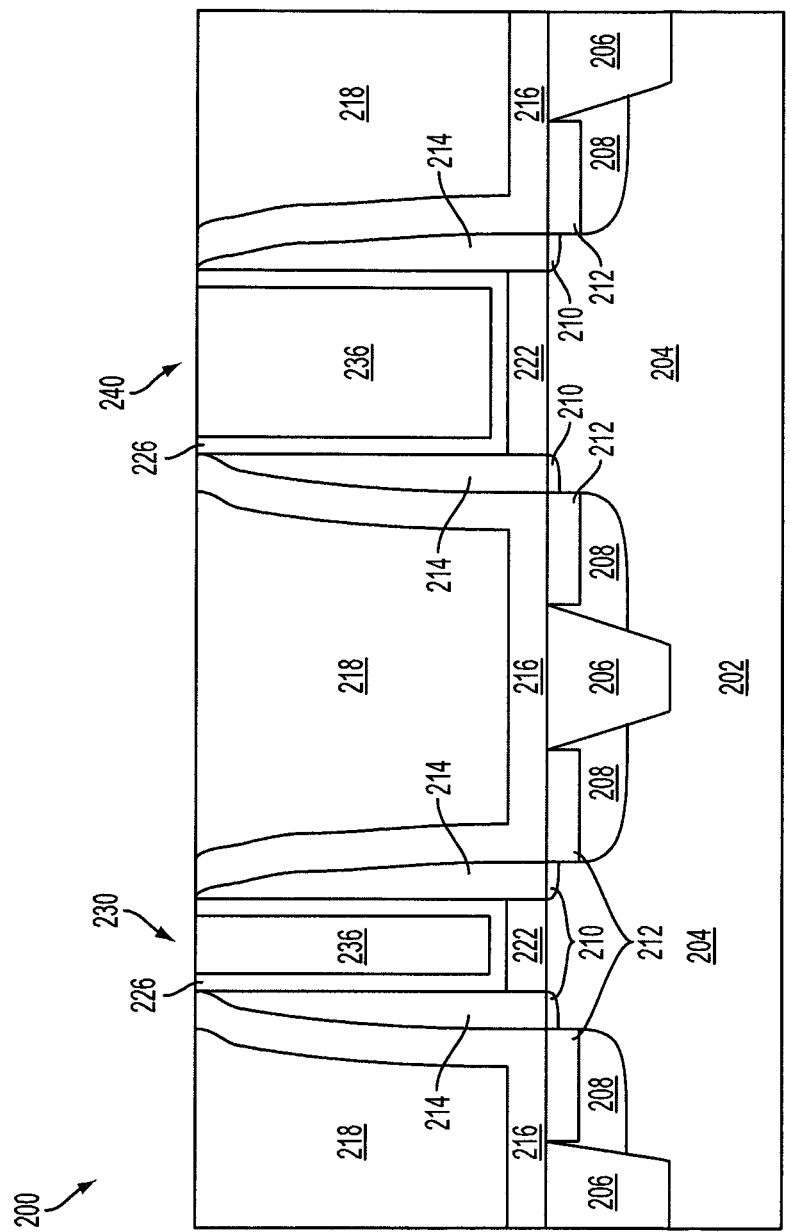

Referring to FIGS. 2A-H, illustrated are schematic cross-sectional views of a metal gate electrode 230 of a field effect transistor (FET) 200 at various stages of fabrication of the method of FIG. 1. It is noted that the method of FIG. 1 does not produce a completed FET 200. A completed FET 200 may be fabricated using complementary metal-oxide-semiconductor (CMOS) technology processing. Accordingly, it is understood that additional processes may be provided before, during, and after the method 100 of FIG. 1, and that some other processes may only be briefly described herein. Also, FIGS. 1 through 2H are simplified for a better understanding of various concepts of the present disclosure. For example, although the figures illustrate the FET 200, it is understood the IC may comprise a number of other devices comprising resistors, capacitors, inductors, fuses, etc.

Referring to FIG. 2A, a substrate 202 is provided. The step of providing a substrate 202 may further comprise partially fabricating one or more FETs 200 on the substrate 202. The semiconductor substrate 202 may comprise a silicon substrate. The substrate 202 may alternatively comprise silicon germanium, gallium arsenic, or other suitable semiconductor materials. The substrate 202 may further comprise other features such as various doped regions, a buried layer, and/or an epitaxy layer. Furthermore, the substrate 202 may be a semiconductor on insulator such as silicon on insulator (SOI). In other embodiments, the semiconductor substrate 202 may comprise a doped epi layer, a gradient semiconductor layer, and/or may further include a semiconductor layer overlying another semiconductor layer of a different type such as a silicon layer on a silicon germanium layer. In other examples, a compound semiconductor substrate may comprise a multilayer silicon structure or a silicon substrate may include a multilayer compound semiconductor structure.

Active regions 204 and isolation regions 206 may be formed in the substrate 202. The active regions 204 may include various doping configurations depending on design requirements as known in the art. In some embodiments, the active regions 204 may be doped with p-type or n-type dopants. For example, the active regions 204 may be doped with p-type dopants, such as boron or $BF_2$; n-type dopants, such as phosphorus or arsenic; and/or combinations thereof. The active regions 204 may be configured for an n-type metal-oxide-semiconductor field-effect transistor (referred to as an nMOSFET) or for a p-type metal-oxide-semiconductor field-effect transistor (referred to as a pMOSFET).

Isolation regions 206 may also be formed in or on the substrate 202 to isolate the various active regions 204. The isolation regions 206 may utilize isolation technology, such as local oxidation of silicon (LOCOS) or shallow trench isolation (STI), to define and electrically isolate the various active regions 204. In the present embodiment, the isolation region 206 includes a STI formed in the substrate 202. The isolation regions 206 may comprise silicon oxide, silicon nitride, silicon oxynitride, fluoride-doped silicate glass (FSG), a low-k dielectric material, other suitable materials, and/or combinations thereof. The isolation regions 206, and in the present embodiment, the STI, may be formed by any suitable process. As one example, the formation of the STI may include patterning the semiconductor substrate 202 by a conventional photolithography process, etching a trench in the substrate 202 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

It is noted that the FETs 200 on the substrate 202 are fabricated using a "gate last" process and other CMOS technology processing. As such, the various features are only briefly discussed herein. In other words, various components of the FET 200 are formed prior to formation of the first and second gate electrodes 230, 240 in a "gate last" process. The various components may comprise source/drain (n-type and p-type S/D) regions 208, lightly doped source/drain regions (n-type and p-type LDD) 210, and silicide regions 212 in the active regions 204 on opposite sides of the first and second gate electrodes 230, 240. The n-type S/D 208 and LDD 210 regions may be doped with P or As, and the p-type S/D 208 and LDD 210 regions may be doped with B or In. The various features may further comprise gate spacers 214, contact etch stop layer (CESL) 216, and an interlayer dielectric (ILD) layer 218 on opposite sidewalls of the first and second gate electrodes 230, 240. The gate spacers 214 may be formed of silicon oxide, silicon nitride or other suitable materials. The CESL 216 may be formed of silicon nitride, silicon oxynitride, or other suitable materials. The ILD layer 218 may include an oxide formed by a high-aspect-ratio process (HARP) and/or high-density-plasma (HDP) deposition process.

In one example of a "gate last" process, a gate dielectric layer 222 and a dummy gate electrode 224, such as dummy poly-silicon, are initially formed and may be followed by CMOS technology processing until deposition of an ILD layer 218. The ILD layer 218 is formed by depositing a dielectric layer over the substrate 202. The ILD layer 218 is deposited as a blanket layer that covers the entire structure. In some embodiments, the gate dielectric layer 222 may include silicon oxide, silicon nitride, silicon oxy-nitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the gate dielectric layer 222 is a high-k dielectric layer with a thickness in the range of about 10 to 30 angstroms. The gate dielectric layer 222 may be formed using a suitable process such as atomic layer deposition (ALD), chemical vapor deposition (CVD), physical vapor deposition (PVD), thermal oxidation, UV-ozone oxidation, or combinations thereof. In alternative embodiment, the gate dielectric layer 222 may be formed after removal of the dummy gate electrode 224 (shown in FIG. 2B). The gate dielectric layer 222 may further comprise an interfacial layer (not shown) to reduce damage between the gate dielectric layer 222 and semiconductor substrate 202. The interfacial layer may comprise silicon oxide.

Then, a chemical mechanical polishing (CMP) is performed on the blanket ILD layer 218 to expose the dummy gate electrode 224. It is understood that the above examples do not limit the processing steps that may be utilized to form the dummy gate electrode 224. It is further understood that the dummy gate dummy gate electrode 224 may comprise additional dielectric layers and/or conductive layers. For example, the dummy gate electrode 224 may comprise hard mask layers, interfacial layers, capping layers, diffusion/barrier layers, other suitable layers, and/or combinations thereof.

In some embodiments, all of the gate electrodes may have similar dimensions, while in other embodiments, some gates may be wider than other gates. The dummy gate electrode 224 may then be removed thereby forming a first trench 232 and a second trench 242 (shown in FIG. 2B). In the present embodiment, a depth D of the first and second trenches 232, 242 may be between about 30 nm and about 50 nm, while a first width $W_1$ of the first trench 232 is in the range of 10 to 30 nm and a second width $W_2$ of the second trench 242 is greater than 30 nm. In other words, the first width $W_1$ of the first trench 232 is less than the second width $W_2$ of the second trench 242. The aspect-ratio (D/W) of the first trench 232 is thus greater than aspect-ratio (D/W) of the second trench 242. One skilled in the art will realize, however, that the dimensions and values recited throughout the descriptions are merely examples, and may be changed to suit different scales of integrated circuits.

Referring to FIG. 2C, after the first and second trenches 232, 242 formation process, a work-function metal layer 226 is then deposited over the ILD layer 218 and into the first and second trenches 232, 242. In one embodiment, the work-function metal layer 226 comprises P-work-function metal layer. The P-work-function metal layer may comprise a material selected from a group of TiN, WN, TaN, and Ru. In another embodiment, the work-function metal layer 226 comprises N-work-function metal layer. The N-work-function metal layer may comprise a material selected from a group of Ti, Ag, Al, TiAl, TiAlN, TaC, TaCN, TaSiN, Mn, and Zr. The work-function metal layer 226 may be formed by CVD, PVD or other suitable technique. The work-function metal layer 226 has a thickness ranging from 1 to 5 nm. In some embodiment, the work-function metal layer 226 may comprise a laminate. The laminate may further comprise a barrier metal layer, a linear metal layer or a wetting metal layer.

It should be noted that the shadow effect of a PVD process is especially prone to formation of a metal overhang 226a at the mouths 232m, 242m of the first and second trenches 232, 242, thereby the metal overhang 226a tends to block a mouth of the high-aspect-ratio trench, for example, the mouth 232m of the first trench 232. Even if this metal overhang 226a does not actually pinch off and close the first trench 232, it will at least reduce a diameter of the mouth 232m of the first trench 232 and consequently impede further metal material from entering into the first trench 232 and generate voids in the first trench 232, thereby increasing the likelihood of device instability and/or device failure.

Accordingly, the processing discussed below with reference to FIGS. 2D-2H and 4A-4D may remove at least a portion of the metal overhang 226a to open the narrowed mouth 232m of the first trench 232 to make it easier for further depositions into the first trench 232. This can reduce void generation in a metal gate electrode in a high-aspect-ratio trench and improve device performance.

FIG. 2D shows the FETs 200 of FIG. 2C after depositing a sacrificial layer 228 over the work-function metal layer 226 and ILD layer 218 to fill the first trench 232, thereby the sacrificial layer 228 is also filled into the second trench 242. In the present embodiment, the sacrificial layer 228 may comprise, but is not limited to, poly-silicon, photo-resist (PR) or Spin-on glass (SOG). The sacrificial layer 228 may be formed by CVD, PVD, ALD, spin-on or other suitable technique. The thickness of the sacrificial layer 228 will depend on remaining depths of the first and second trenches 232, 242 after deposition of the work-function metal layer 226. Accordingly, the sacrificial layer 228 is deposited until the first and second trenches 232, 242 are substantially filled.

Referring to FIG. 2E, following filling of the sacrificial layer 228 into the first trench 232, a CMP process is performed to remove a portion of the sacrificial layer 228 and the work-function metal layer 226 outside the first and second trenches 232, 242. The CMP process may stop when reaching the ILD layer 218, and thus providing a substantially planar surface. Accordingly, the CMP process removes at least a portion of the metal overhang 226a to open the narrowed mouth 232m of the first trench 232 for further metal depositions.

Referring to FIG. 2F, after the CMP process, the remaining sacrificial layer 228 within the first and second trenches 232, 242 is removed by an etching process to expose the work-function metal layer 226 within the first and second trenches 232, 242. The etching process may include a dry etching process and/or a wet etching process. In one embodiment, the wet etching process comprises removing a sacrificial layer 228 comprising SOG in the first and second trenches 232, 242 in a solution comprising HF. In another embodiment, in which the sacrificial layer 228 may be SOG, PR, or poly-silicon, the step of the dry etching process is performed using F, Cl, and Br based etchants. The process steps up to this point have provided a substrate having an open mouth 232m of the first trench 232 to make it easier for further depositions into the first trench 232. This can reduce void generation in a metal gate electrode in a high-aspect-ratio trench and improve device performance.

In the present embodiment, using the sacrificial layer 228 as a protection layer for the work-function metal layer 226 may impede entry of the polish slurry (used during the CMP process) into the low-aspect-ratio trench, thereby avoiding damage to the work-function metal layer 226 and improve device performance.

Referring to FIG. 2G, after removal of the remaining sacrificial layer 228 within the first and second trenches 232, 242, a signal metal layer 236 is deposited over the work-function metal layer 226 to fill the first and second trenches 232, 242. In the present embodiment, the signal metal layer 236 may comprise a material selected from a group of Al, Cu and W. The signal metal layer 236 may be formed by CVD, PVD, plating, spin-on, ALD, or other suitable technique. In some embodiment, the signal metal layer 236 may comprise a laminate. The laminate may further comprise a barrier metal layer, a linear metal layer or a wetting metal layer. Further, the thickness of the signal metal layer 236 will depend on the depth of the first and second trenches 232, 242. The signal metal layer 236 is thus deposited until the first and second trenches 232, 242 is substantially filled.

Referring to FIG. 2H, another CMP is performed to planarize the signal metal layer 236 after the filling of the first and second trenches 232, 242. Since the CMP removes a portion of the signal metal layer 236 outside the first and second trenches 232, 242, the CMP process may stop when reaching the ILD layer 218, and thus providing a substantially planar surface. In one embodiment, the work-function metal layer 226 and signal metal layer 236 in the first trench 232 are combined and referred to as a metal gate electrode 230. In another embodiment, the work-function metal layer 226 and signal metal layer 236 in the second trench 242 are combined and referred to as a metal gate electrode 240. Accordingly, the method of fabricating a FET 200 in accordance with one or more embodiments described herein may fabricate a void-free metal gate electrode to reduce gate resistance and improve device performance.

Figure 3:
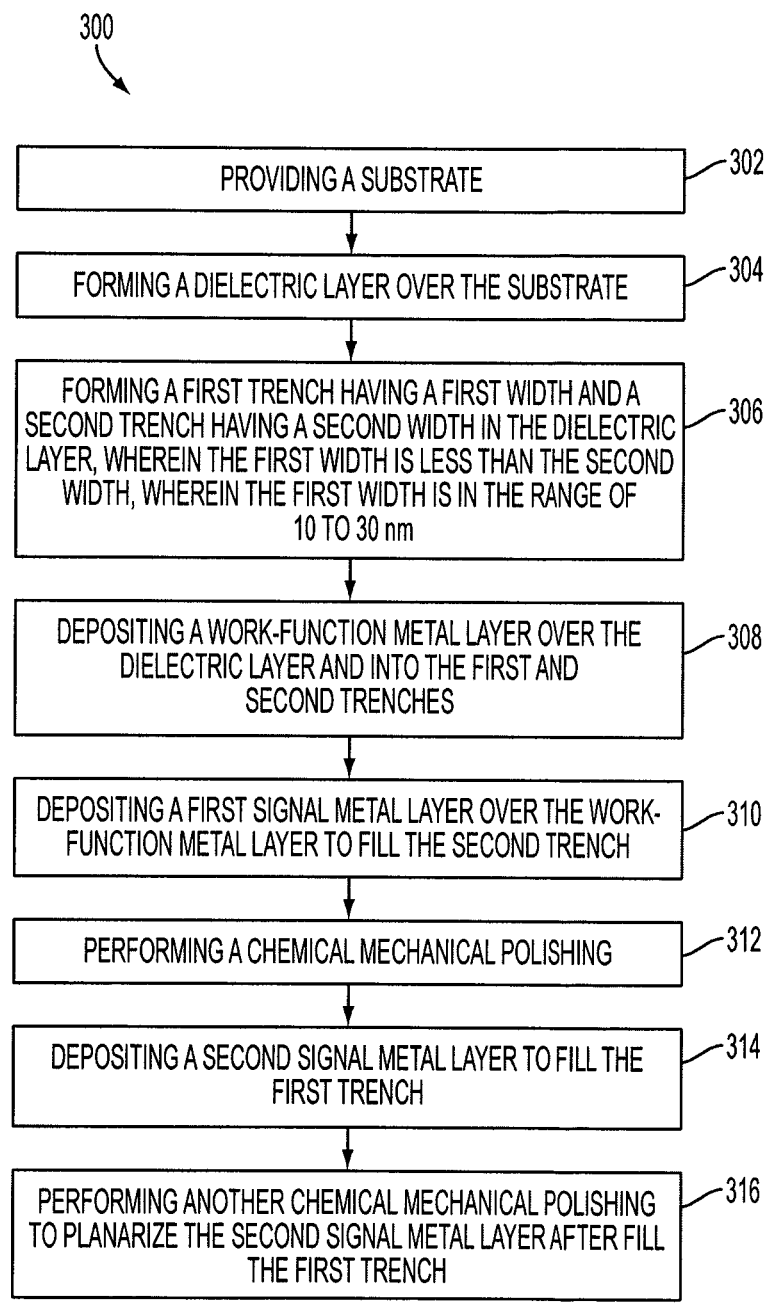
FIG. 3 is a flowchart illustrating a method for fabricating a metal gate electrode according to various aspects of the present disclosure.

FIG. 3 is a flowchart of an alternate method 300 for fabricating a metal gate electrode according to various aspects of the present disclosure. The method 300 begins with step 302 in which a substrate is provided. The method 300 continues with step 304 in which a dielectric layer is formed over the substrate. The method 300 continues with step 306 in which a first trench having a first width and a second trench having a second width are formed in the dielectric layer, wherein the first width is less than the second width, wherein the first width is in the range of 10 to 30 nm. The method 300 continues with step 308 in which a work-function metal layer is deposited over the dielectric layer and into the first and second trenches. The method 300 continues with step 310 in which a first signal metal layer is deposited over the work-function metal layer to fill the second trench. The method 300 continues with step 312 in which a chemical mechanical polishing is performed. The method 300 continues with step 314 in which a second signal metal layer is deposited to fill the first trench. The method 300 continues with step 316 in which another chemical mechanical polishing is performed to planarize the second signal metal layer after fill the first trench. In some embodiments, one or more of the described steps are performed in different orders or replaced with other steps or omitted. The discussion that follows illustrates one or more embodiments of a method in accordance with FIG. 4.

Figure 4A:
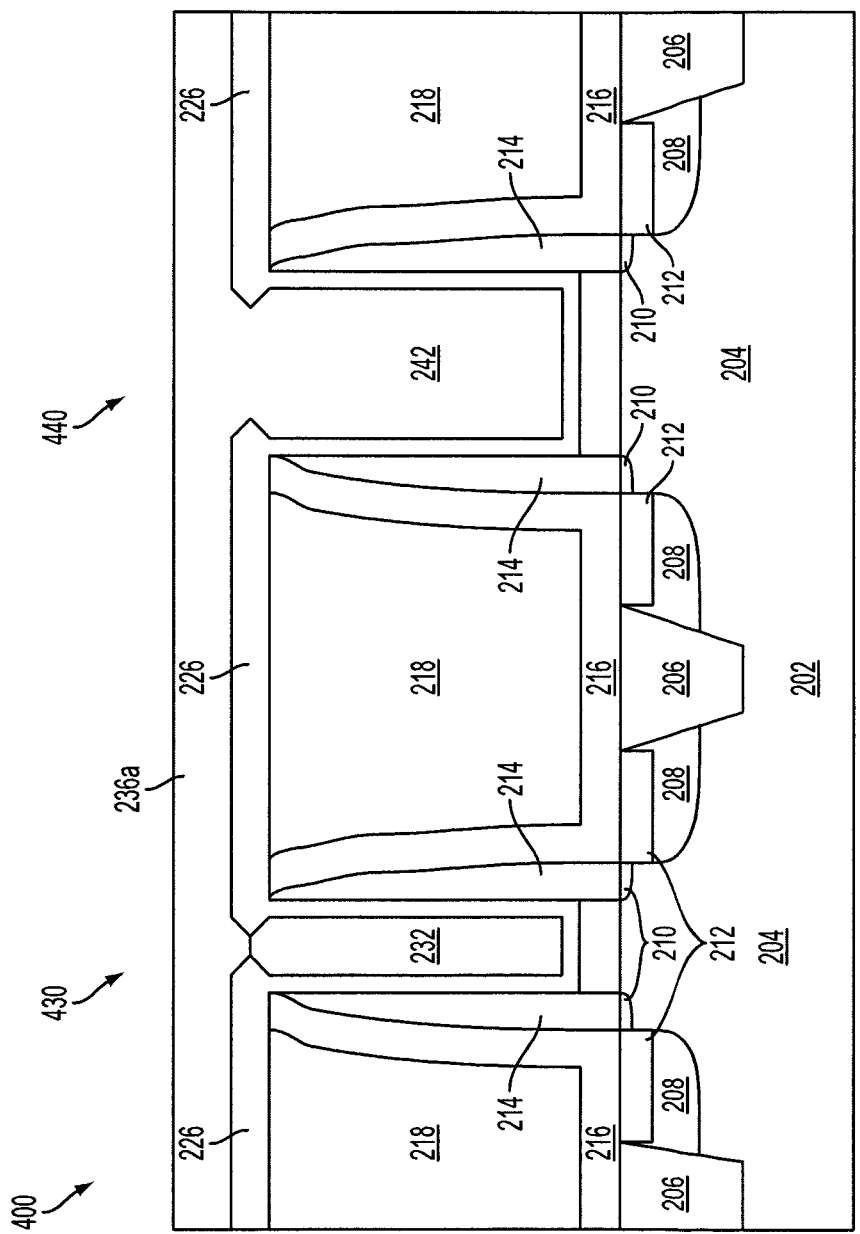
Figure 4B:
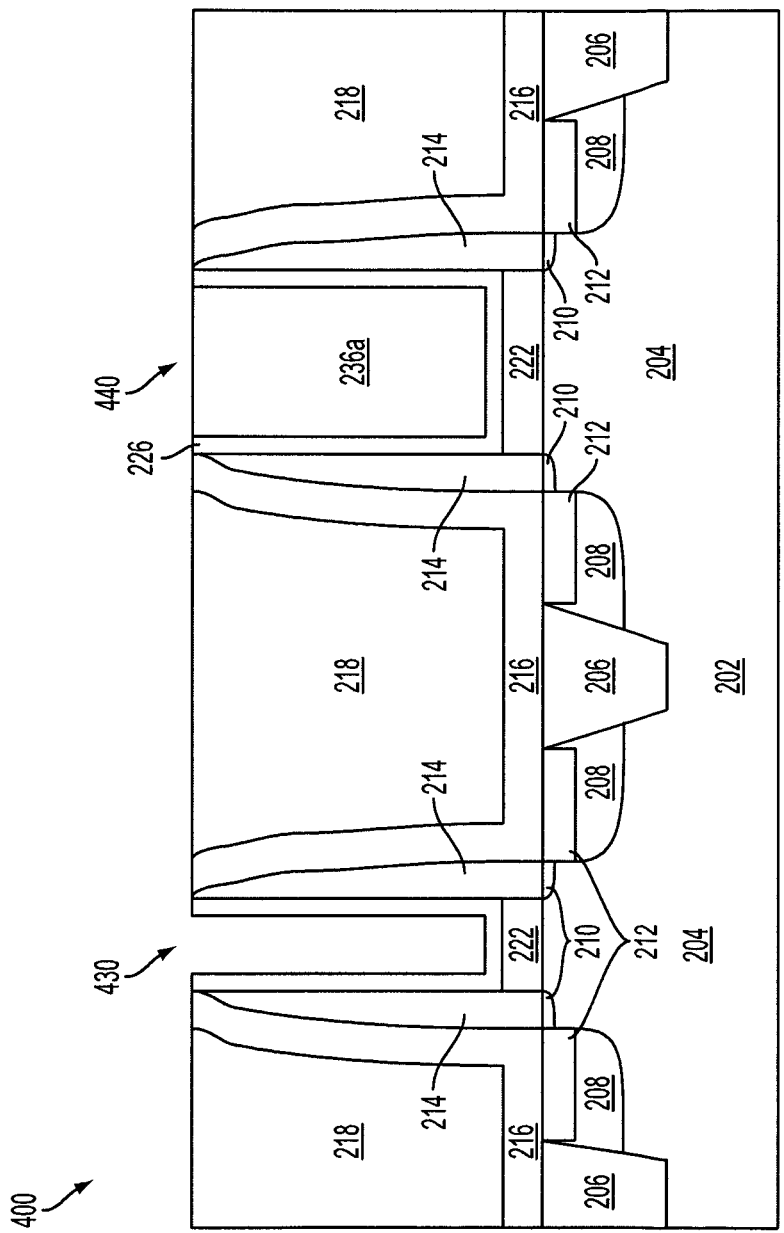
Figure 4D:
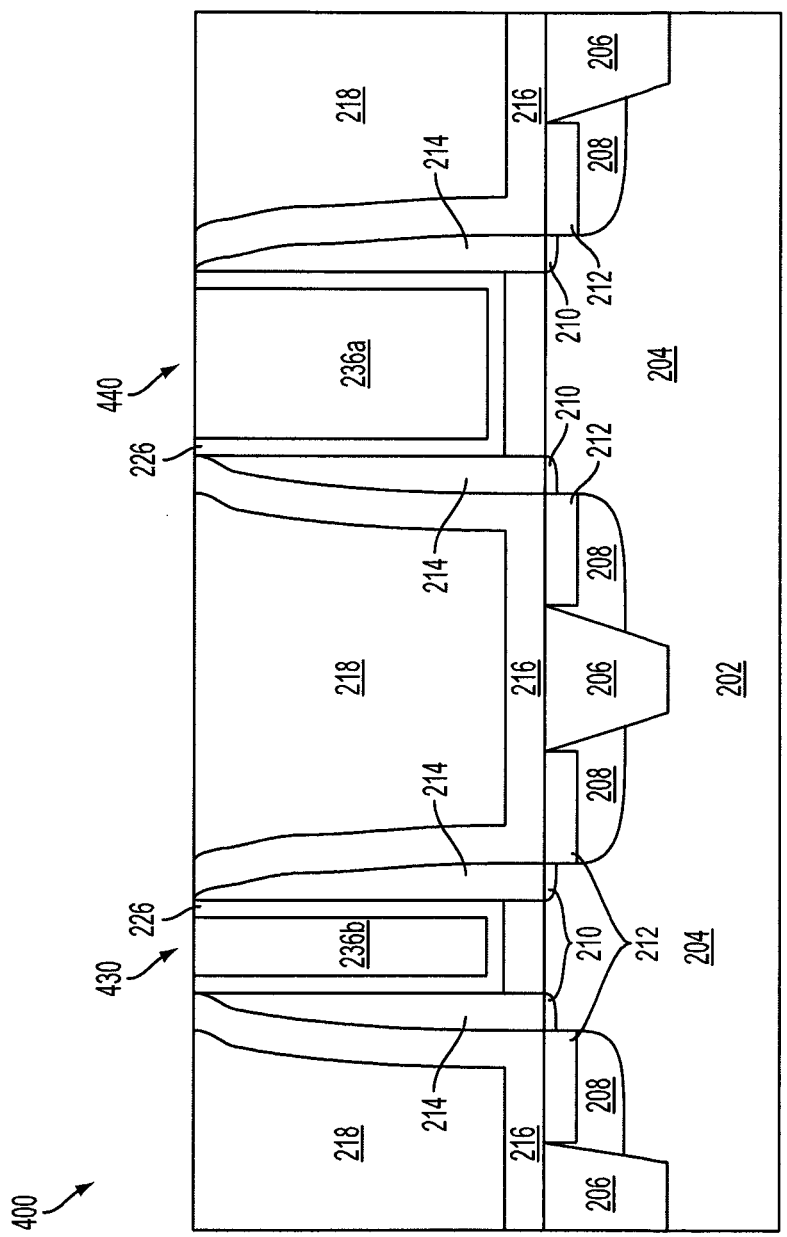

Referring to FIGS. 4A-D, illustrated are schematic cross-sectional views of a metal gate electrode 430 of a field effect transistor (FET) 400 at various stages of fabrication according to various aspects of the present disclosure. It is noted that the method of FIG. 3 does not produce a completed FET 400. A completed FET 400 may be fabricated using complementary metal-oxide-semiconductor (CMOS) technology processing. Accordingly, it is understood that additional processes may be provided before, during, and after the method 300 of FIG. 3, and that some other processes may only be briefly described herein. Also, FIGS. 3 through 4D are simplified for a better understanding of various concepts of the present disclosure. For example, although the figures illustrate the FET 400, it is understood the IC may comprise a number of other devices comprising resistors, capacitors, inductors, fuses, etc. Further, the FET 400 is similar to the FET 200 of FIG. 2. Accordingly, similar feature in FIGS. 2 and 4 are numbered the same for the sake of clarity and simplicity.

FIG. 4A shows the FETs 400 (200 in FIG. 2C) after depositing a first signal metal layer 236a over the work-function metal layer 226 to fill the second trench 242 (step 310 of FIG. 3), while the first signal metal layer 236a is not deposited into the first trench 232 due to the metal overhang 226a. In the present embodiment, the first signal metal layer 236a may comprise a material selected from a group of Al, Cu and W. The first signal metal layer 236a may be formed by CVD, PVD, plating, spin-on, ALD, or other suitable technique. In some embodiment, the first signal metal layer 236a may comprise a laminate. The laminate may further comprise a barrier metal layer, a linear metal layer or a wetting metal layer. Further, the thickness of the first signal metal layer 236a will depend on the depth of the second trench 242. Accordingly, the first signal metal layer 236a is deposited until the second trench 242 is substantially filled.

Referring to FIG. 4B, a CMP is performed to planarize the first signal metal layer 236a after fill the second trenches 242. The CMP removes portions of the first signal metal layer 236a and work-function metal layer 226 outside the first and second trenches 232, 242, the CMP process may stop when reaching the ILD layer 218, and thus providing a substantially planar surface. Accordingly, the CMP process removes at least a portion of the metal overhang 226a to open the mouth 232m of the first trench 232 to make it easier for further depositions into the first trench 232. This can reduce void generation in a metal gate electrode in a high-aspect-ratio trench and improve device performance.

Referring to FIG. 4C, after removal of the portions of the first signal metal layer 236a and work-function metal layer 226 outside the first and second trenches 232, 242, a second signal metal layer 236b is deposited over the work-function metal layer 226 to fill the first trenches 232, while the second signal metal layer 236b is not deposited into the second trench 242 because the second trench 242 has already been filled with the first signal metal layer 236a. In the present embodiment, the second signal metal layer 236b may comprise a material selected from a group of Al, Cu and W. The second signal metal layer 236b may be formed by CVD, PVD, plating, spin-on, ALD, or other suitable technique. In some embodiment, the second signal metal layer 236b may comprise a laminate. The laminate may further comprise a barrier metal layer, a linear metal layer or a wetting metal layer. Further, the thickness of the second signal metal layer 236b will depend on the depth of the first trench 232. Accordingly, the second signal metal layer 236b is deposited until the first trench 232 is substantially filled.

Referring to FIG. 4D, another CMP is performed to planarize the second signal metal layer 236b after the filling of the first trench 232. Since the CMP removes portion of the second signal metal layer 236b outside the first and second trenches 232, 242, the CMP process may stop when reaching the ILD layer 218, and thus providing a substantially planar surface. In one embodiment, the work-function metal layer 226 and second signal metal layer 236b in the first trench 232 are combined and referred to as a metal gate electrode 430. In another embodiment, the work-function metal layer 226 and first signal metal layer 236a in the second trench 242 are combined and referred to as a metal gate electrode 440. Accordingly, the method of fabricating a FET 400 in accordance with one or more embodiments described herein may fabricate a reduced-void metal gate electrode to reduce gate resistance and improve device performance.

It is understood that the FETs 200, 400 may undergo further CMOS processing to form various features such as contacts/vias, interconnect metal layers, dielectric layers, passivation layers, etc.

Some exemplary embodiments in accordance with the present disclosure include methods for fabricating a metal gate electrode. Such methods encompass forming a dielectric layer over a substrate, forming a first trench having a first width and a second trench having a second width in the dielectric layer, the first width being less than the second width. Also encompassed by such methods is depositing a work-function metal layer over the dielectric layer and into the first and second trenches, the deposited work-function layer being in direct contact with the top surface of the dielectric layer and depositing a first signal metal layer over the work-function metal layer, where the second trench is filled and filling the first trench by depositing a second signal metal layer.

Other methods in accordance with exemplary embodiments of the present disclosure include forming a dielectric layer over a substrate and forming both a first and a second trench in the dielectric layer where the first trench has a first depth and the second trench has a second depth. Such other methods further encompass depositing a work-function metal layer over the dielectric layer and into both the first and second trenches where such depositing forms a narrowing overhang and where the work-function metal layer is in direct contact with a top surface of the dielectric layer. In addition such other methods encompass chemical mechanical polishing (CMP) to remove the work-function metal layer from outside the trenches such that a top surface of the sacrificial layer is substantially co-planar with the top surface of the dielectric layer and where the polishing removes an entirety of the aforementioned narrowing overhang and where the CMP stops at the top surface of the dielectric layer. Still further, such other methods encompass depositing a signal metal layer that fills at least one trench of the first or second trenches that have the exposed work-function metal layer.

Still other methods in accordance with exemplary embodiments of the present disclosure encompass forming a dielectric layer over a substrate, forming a trench in the dielectric layer and depositing a gate dielectric layer into the trench. Also, encompassed is depositing a work-function metal layer over the dielectric layer and into the trench, where the work-function metal layer forms a narrowing overhang extending beyond the work-function metal layer that is deposited on sidewalls of the trench. The deposited work-function metal layer is in direct contact with the top surface of the dielectric layer. Chemical mechanical polishing is performed to remove the work-function metal layer and the aforementioned narrowing overhang, in its entirety, the polishing stopping at the top surface of the dielectric layer. In addition, depositing a signal metal layer to fill the trench is encompassed by such still other embodiments.

While several exemplary embodiments have been described, it is to be understood that the scope of this disclosure is not limited to such disclosed embodiments. To the contrary, the scope of the present disclosure is intended to cover various modifications and similar arrangements (as would be apparent to those skilled in the art). Therefore, the scope of the appended claims should be accorded the broadest interpretation so as to reasonably encompass all such modifications and similar arrangements.

What is claimed is:

1. A method for fabricating a metal gate electrode, comprising:
    forming a dielectric layer and a dummy gate layer over a substrate;
    etching the dummy gate layer to form a first trench and a second trench having a depth, the first trench having a first width and the second trench having a second width larger than the first width in the dielectric layer, wherein the first trench has a higher aspect ratio than the second trench;
    depositing one of an N-type or a P-type work-function metal layer over the dielectric layer and into both the first and second trenches wherein the work-function metal layer is in direct contact with the top surface of the dielectric layer;
    first depositing a first signal metal layer over the work-function metal layer to fill the second trench; and
    second depositing a second signal metal layer to fill the first trench.

2. The method of claim 1, further comprising:
    performing a planarization process to planarize the second signal metal layer after filling the first trench.

3. The method of claim 1, wherein forming the first trench comprises forming the first trench having the first width in the range of 10 to 30 nm and forming the second trench comprises forming the second trench having the second width greater than 30 nm.

4. The method of claim 1, wherein depositing the work-function layer comprises depositing the work-function metal layer comprising a P-type work-function metal layer comprising at least one material selected from the group consisting of TiN, WN, TaN, and Ru.

5. The method of claim 1, wherein said forming the first and second trenches in the dielectric layer comprises removing respective first and second dummy gate electrodes formed in the dielectric layer.

6. The method of claim 1, wherein depositing the work-function layer comprises depositing the work-function metal layer comprising an N-type work-function metal layer which comprises at least one material selected from the group consisting of Ti, Ag, Al, TiAl, TiAlN, TaC, TaCN, TaSiN, Mn, and Zr.

7. The method of claim 1, further comprising performing a chemical mechanical polishing (CMP) to remove the first signal metal layer outside the trenches wherein said CMP stops when reaching the dielectric layer.

8. The method of claim 1, wherein depositing the first signal metal layer or depositing the second signal metal layer comprises depositing at least one material selected from the group consisting of W, Al, and Cu.

9. The method of claim 1, wherein the work-function metal layer deposited into the first trench includes an overhang at an opening of the first trench, said overhang restricts entry of the first signal metal layer into the first trench.

10. The method of claim 1, wherein said removing the sacrificial layer in the trench is performed using a dry etching process.

11. The method of claim 10, wherein the dry etching process is performed using F, Cl, or Br based etchants.

12. A method for fabricating a metal gate electrode, comprising:
    forming a dielectric layer on a substrate;
    forming a first trench and a second trench in the dielectric layer, wherein the first trench has a first depth and the second trench has a second depth;
    depositing a work-function metal layer over the dielectric layer and into the first trench and the second trench, wherein depositing the work-function metal layer comprises forming a narrowing overhang and the work-function metal layer is in direct contact with a top surface of the dielectric layer;
    performing a chemical mechanical polishing (CMP) to remove the work-function metal layer outside the trenches such that a top surface of the sacrificial layer is substantially co-planar with the top surface of the dielectric layer, wherein performing the CMP removes an entirety of the narrowing overhang, and the CMP stops at the top surface of the dielectric layer; and
    depositing a signal metal layer to fill the at least one trench of the first trench or the second trench having the exposed work-function metal layer.

13. The method of claim 12, wherein depositing the signal metal layer comprises filling at least one of the first trench having the first depth or the second trench having the second depth.

14. The method of claim 12, wherein forming the first trench and the second trench comprises forming the first trench having a first width and the second trench having a second width, the first width being less than the second width.

15. The method of claim 14, wherein forming the first trench the comprises forming the first trench having a first width in the range of 10 to 30 nm and forming the second trench having a second width greater than 30 nm, the first trench having a first aspect ratio and the second trench having a second aspect ratio different than the first aspect ratio.

16. The method of claim 12, wherein the work-function metal layer comprises an N-work-function metal layer which comprises a material selected from the group consisting of Ti, Ag, Al, TiAl, TiAlN, TaC, TaCN, TaSiN, Mn, and Zr.

17. A method for fabricating a metal gate electrode, comprising:
    forming a dielectric layer over a substrate;
    forming a trench in the dielectric layer;
    depositing a gate dielectric layer into the trench;
    depositing a work-function metal layer over the dielectric layer and into the trench, wherein depositing the work-function metal layer comprises forming a narrowing overhang extending beyond the work-function metal layer on sidewalls of the trench, and the work-function metal layer is in direct contact with the top surface of the dielectric layer;
    performing a chemical mechanical polishing (CMP) to remove the work-function metal layer, wherein performing the CMP removes an entirety of the narrowing overhang, and the CMP stops at the top surface of the dielectric layer; and
    depositing a signal metal layer to fill the trench.

18. The method of claim 17, wherein depositing the gate dielectric layer comprises depositing a high-k dielectric layer using at least one of atomic layer deposition (ALD), chemical vapor depositing (CVD), physical vapor deposition (PVD), thermal oxidation, or ultra-violet (UV)-ozone oxidation.

19. The method of claim 17, wherein forming the trench comprises forming a plurality of trenches wherein at least one trench of the plurality of trenches has a different width than another trench of the plurality of trenches.

20. The method of claim 17, wherein depositing the signal metal layer comprises depositing a material selected from the group consisting of W, Al, and Cu.

\* \* \* \* \*